United States Patent [19]

Ozawa

[11] Patent Number: 5,443,644
[45] Date of Patent: Aug. 22, 1995

[54] GAS EXHAUST SYSTEM AND PUMP CLEANING SYSTEM FOR A SEMICONDUCTOR MANUFACTURING APPARATUS

[75] Inventor: Osamu Ozawa, Nagano, Japan

[73] Assignee: Kashiyama Industry Co., Ltd., Tokyo, Japan

[21] Appl. No.: 213,087

[22] Filed: Mar. 15, 1994

[51] Int. Cl.⁶ .......... C23C 16/00; F01C 1/16; B08B 3/00
[52] U.S. Cl. .............. 118/715; 418/201.1; 134/169 R
[58] Field of Search .......... 417/203; 418/201.1, 418/104; 134/168 R; 118/715

[56] References Cited

U.S. PATENT DOCUMENTS

| | | | |
|---|---|---|---|
| 3,182,670 | 5/1965 | Howell | 134/169 R |
| 5,011,520 | 4/1991 | Carr | 55/228 |
| 5,158,644 | 10/1992 | Cheung | 156/643 |
| 5,197,861 | 3/1993 | Maruyama | 417/42 |
| 5,295,798 | 3/1994 | Maruyama | 418/201.1 |
| 5,302,089 | 4/1994 | Maruyama | 417/199.1 |
| 5,348,448 | 9/1994 | Ikemoto | 417/17 |
| 5,352,097 | 10/1994 | Itou | 417/42 |

*Primary Examiner*—R. Bruce Breneman
*Assistant Examiner*—Jeffry Lurd
*Attorney, Agent, or Firm*—Burns, Doane, Swecker & Mathis

[57] ABSTRACT

A gas exhaust system for use in a semiconductor manufacturing process wherein mechanical or chemical processing is applied on silicon wafers or the like arranged in a air-tight process chamber thereof, comprises a vacuum chamber having a gas suction port formed on an upper side thereof and a gas exhaust port formed on a lower side thereof. In the vacuum chamber, the first and second rotors are arranged vertically and supported rotatably at their lower end port ions in a cantilevered condition. The first and second rotors are driven to rotate in the opposite directions to thereby form a certain degree of vacuum condition in the vacuum chamber, whereby the residual gasses in the process chamber are discharged therefrom through the gas exhaust system. Since the the rotors are supported in a cantilevered condition and the bearing mechanisms for the rotors are positioned apart from the suction port of the vacuum chamber, oil supplied to the bearing mechanism does not diffuse or leak into the side of the process chamber.

2 Claims, 3 Drawing Sheets

GAS EXHAUST SYSTEM AND PUMP CLEANING SYSTEM FOR A SEMICONDUCTOR MANUFACTURING APPARATUS

BACKGROUND OF INVENTION

1. Field of the Invention

The present invention generally relates to a gas exhaust system for removing extraneous gasses, resultant by-product gasses or the like from a process chamber of a semiconductor manufacturing device such as a CVD apparatus. In particular, the present invention pertains to a gas exhaust system for use in a semiconductor manufacturing process, which is capable of preventing oil leakage from a vacuum pump provided therein to the side of a process chamber of a semiconductor manufacturing device in which wafers or substrates to be processed are arranged, and which is capable of maintaining the vacuum pump of the gas exhaust system to be an optimum operational state.

2. Related Art Description

There have been known a variety of semi conductor manufacturing devices such as a CVD device. The CVD device, for example, has an air-tight process chamber in which a plurality of silicon wafers or the like to be processed are arranged. After the wafers are processed in the chamber, residual gasses, resulting by-product gasses must be removed from the process chamber of the device. For this purpose, a gas exhaust system is provided to the semiconductor manufacturing devices.

One such conventional gas exhaust systems has an oil rotary vacuum pump. This type of pump has a cylinder arranged in oil stored in a casing thereof and eccentric rotors rotatably arranged in the cylinder. The rotors are rotated in the cylinder in a condition that sealing is formed between the vanes of the rotors and the inner surface of the cylinder, so that a certain degree of vacuum state is formed in the cylinder, and therefore, the gases remaining in the process chamber of the semiconductor manufacturing device can be exhausted via the pump.

However, in this system, the sealing oil in the pump may leak or diffuse therefrom and flows into the process chamber of the device to deposit on the surface of the chamber. If a large amount of sealing oil is leaked into the process chamber of the device, it cannot be expected to perform an appropriate processing of the silicon wafers arranged in the chamber. In addition, it may fall into a condition that an oil-free state on an order of $10^{-3}$ Tort cannot be created in the chamber.

Another typical gas exhaust system associated with the semiconductor manufacturing devices is one that has a root-type multi-stage pump. The root-type pump has a pair of rotors of a cocoon shape which are arranged in a cylinder having an elliptic section in a manner that they are offset by 90 degrees with respect to each other. By rotation of the rotors, gas exhaust operation is carried out. Typically, a plurality of this type of pumps are connected serially to form a root-type multi-stage pump system.

In this system, the gasses exhausted from the process chamber of the semiconductor manufacturing device are sometimes excessively or unneccessary compressed in the pump. Thus, the exhausted gasses are condensed and solidified in the pump, which causes clogging of the rotors of the pump and to undesirably stop the operation of the pump. When the rotors fall in a clogged condition, the pump itself must be removed from the gas exhaust line of the semiconductor manufacturing device so that it is disassembled and is washed to remove the deposits therein. This kind of recovery operation of the pump takes much time, usually at least several days, and during this recovery operation, the semiconductor manufacturing line must be stopped. This reduces the productivity of the manufacturing line. Further, it is observed that the lubricant oil of the pump leaks into the process chamber of the semiconductor manufacturing device, although the amount of which is not so much as that occurred in the above-mentioned oil vacuum pump.

OBJECTS AND SUMMARY

Accordingly, an object of the present invention is to provide a gas exhaust system for use in a semiconductor manufacturing process which is capable of preventing oil diffuse or leakage into a process chamber of the semiconductor manufacturing device.

Another object of the present invention is to provide a gas exhaust system for use in a semiconductor manufacturing process which is capable of preventing condensation or deposition of exhaust gases in the pump, thereby maintaining the operationability of the pump.

Another object of the present invention is to provide a gas exhaust system for use in a semiconductor manufacturing process which can be washed to remove deposits in the system in a short period of time and without having to disassemble it from the manufacturing line.

In order to achieve the above and other objects, according to the present invention, there is provided a novel gas exhaust system for use in semiconductor manufacturing process in which mechanical or chemical processing is applied on silicon wafers arranged in a air-tight process chamber thereof. The gas exhaust system according to the present invention comprises a vacuum chamber having a gas suction port formed on an upper side thereof and a gas exhaust port formed on a lower side thereof, a first rotor means having a rotor shaft and a rotor fixed on said rotor shaft and formed on a circumferential surface thereof with a rectangular-shaped screw, and a second rotor means having a rotor shaft and a rotor fixed on said rotor shaft and formed on a circumferential surface thereof with a rectangular-shaped screw, wherein said first and second rotor means are rotatably supported by said lower side of said vacuum chamber so that they are arranged vertically and parallel with each other in said vacuum chamber in a cantilevered condition.

In operation, the first and second rotor means are rotated by an appropriate drive means in opposite directions, so that gasses sealed in spaces defined between the rotors and between the rotors and the inner surface of the vacuum chamber are transferred in a compressed state from the gas suction port to the gas exhaust port. Therefore, by connecting the gas intake port of the system to a gas exhaust port of a semiconductor manufacturing device via a pipe, residual gasses in the process chamber of the device are removed therefrom and recovered through the gas exhaust system of the present invention.

According to the present invention, since gasses passing through the gas exhaust passage defined by the present system do not suffer from excess compression or repeatable compression, condensation of the gasses while passing through the gas exhaust passage does not occur. In addition, the gas exhaust passage is wide and simple, and is short compared to the conventional system, so that the gasses will not be cooled to condense while passing through the gas exhaust passage. Whereby, clogging of the rotors due to deposition of the condensed gasses can be avoided, thereby realizing a long-time maintenance-free operation of the gas exhaust system.

Furthermore, since the rotor shafts of the respective rotor means are arranged vertically in a cantilevered condition and have no bering portions at the side of gas suction port in the vacuum chamber, oil leakage or diffusion from the vacuum chamber to the process chamber of the device can effectively be prevented.

According to another aspect of the present invention, there is provided a gas exhaust system for use in a semiconductor manufacturing process wherein mechanical or chemical processing is applied on silicon wafers or the like arranged in a process chamber, which comprises a vacuum chamber having a gas suction port formed on an upper side thereof and a gas exhaust port formed on a lower side thereof, a branched passage means which has a main passage connected to said gas suction port and first and second branch passages branched from said main passage, said first passage being designed to connect via a gas exhaust pipe to said process chamber and said second passage designed to connect to a flush pipe through which a flushing liquid is supplied to said vacuum chamber, a first valve means provided between said first branch passage and said gas exhaust pipe, a second valve means provided between said second branch passage and said flush pipe, a first rotational shaft which has an upper said side shaft portion extending vertically and upwardly in said vacuum chamber from said lower side of said vacuum chamber and a lower-side shaft portion extending vertically and downwardly from said lower side of said vacuum chamber, a second rotational shaft arranged parallel to said first shaft portion and apart therefrom by a prescribed distance which has an upper-side shaft portion extending vertically and upwardly in said vacuum chamber from said lower side of said vacuum chamber and a lower-side shaft portion extending vertically and downwardly from said lower side of said vacuum chamber, first and second rotors fixed on said upper-side shaft portions of said first and second shaft, respectively which are formed with rectangular-shaped screws on their circumferential surfaces, said screws being designed to engage with each other, a first bearing means for rotationally supporting upper sides of said lower-side shaft portions of said first and second shafts, a second bearing means for rotationally supporting lower sides of said lowers side shaft portions of said first and second shafts, and a drive means for rotating said first and second shafts in opposite rotational directions.

According to the thus constituted gas exhaust system, a normal gas exhausting operation is carried out in a condition that the first valve means is open while the second valve means is closed. Whereas, when required to wash in the system, the first valve means is closed and the second valve means is opened to connect the gas intake port of the vacuum chamber to the flush pipe side. Then the system is driven by the driving means and a washing liquid is supplied to the system via the second valve means and the gas suction port. Therefore, the washing operation of the system can be carried out without removing the system from the semiconductor manufacturing line. Further, since the first and second shafts are arranged vertically and have no bearing portions on the side where the gas suction port is formed, the washing operation can be carried out easily and effectively.

In still another aspect of the present invention, there is provided a semiconductor manufacturing system having a gas exhaust system comprising a process chamber in which mechanical or chemical processing is applied to silicon wafers or the like arranged therein, a gas exhaust system for removing gasses remained in said process chamber, and a washing-liquid supplying means for supplying a washing liquid in order to wash said gas exhaust system. The gas exhaust system comprises a vacuum chamber having a gas suction port formed on an upper side thereof and a gas exhaust port formed on a lower side thereof, a branched passage means which has a main passage connected to said gas suction port and first and second branch passages branched from said main passage, said first passage being connected to said processing chamber via a gas exhaust line, and said second passage being connected to said flushing-liquid supplying means, a first valve means provided between said first branch passage and said processing chamber, a second valve means provided between said second branch passage and said washing-liquid supplying means, a first rotational shaft which has an upper-side shaft portion extending vertically and upwardly in said vacuum chamber from said lower side of said vacuum chamber and a lower-side shaft portion extending vertically and downwardly from said lower side of said vacuum chamber, a second rotational shaft arranged parallel to said first shaft portion and apart therefrom by a prescribed distance which has an upper-side shaft portion extending vertically and upwardly in said vacuum chamber from said lower side of said vacuum chamber and a lower-side shaft portion extending vertically and downwardly from said lower side of said vacuum chamber, first and second rotors fixed on said upper-side shaft portions of said first and second shaft, respectively which are formed rectangular-shaped screws on their circumferential surfaces, said screws being designed to engage with each other, a first bearing means for rotationally supporting upper sides of said lower-side shaft port ions of said first and second shafts, a second bearing means for rotationally supporting lower sides of said lower-side shaft portions of said first and second shafts, and, a drive means for rotating said first and second shafts in opposite directions.

The above and other objects and advantages of the present invention will be apparent from reading the following description in connection with the attached drawings.

DESCRIPTION OF THE PREFERRED EMBODIMENT

While the present invention will be described with reference to the preferred embodiment, it is not intended to limit the present invention to this embodiment. On the contrary, it is intended to cover all alternatives, modifications and equivalents as may be included within the scope or spirit of the present invention defined by the attached claims.

Figure 1:
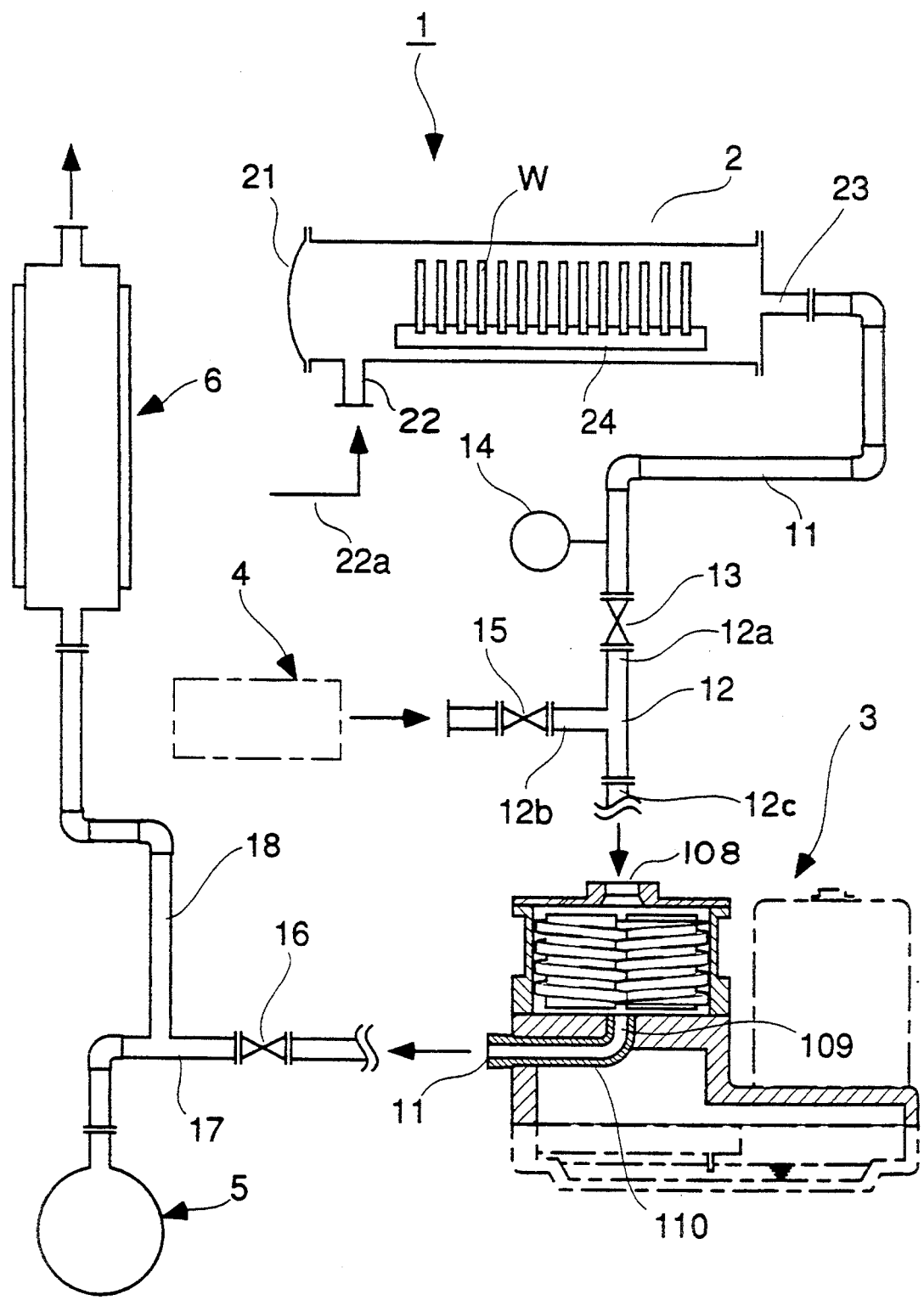
FIG. 1 is a schematic diagram of a semiconductor manufacturing device having a gas exhaust system of an example according to the present invention.

Referring now to FIG. 1, a semiconductor manufacturing device having a gas exhaust system is illustrated. The device 1 of the present example has a process chamber 2 wherein chemical processing is applied on silicon wafers or the like arranged therein, a gas exhaust system 3 for removing gasses from the process chamber 2, a washing-liquid supplying system 4 for supplying washing liquid to the gas exhaust system 3, a recovery tank 5 for recovering the washing liquid, and a trap system 6 for filtering solidified contents from the exhaust gasses and discharging them to the atmosphere.

The process chamber 2 has a port 21 through which work pieces to be processed such as silicon wafers are loaded in and unloaded from the chamber 2, a gas supplying port 22 through which a reactive gas 22a is introduced in the chamber 2, and a gas outlet port 23 through which residual gasses in the chamber 2 are exhausted. The wafers W to be processed are transferred into the chamber 2 in a manner that they are aligned on a carriage 24. The gas outlet port 23 is connected to an end of a gas exhaust pipe 11. The other end of the pipe 11 is connected to one end 12a of a branch pipe 12 via a gas exhaust valve 13. The gas exhaust valve 13 may be of manual or electromagnetic type. The gas exhaust pipe 11 is provided with a pressure meter 14 for monitoring the pressure in the pipe 11.

The branch pipe 12 has three connecting ends 12a, 12b and 12c, among which the end 12a is connected to the gas exhaust pipe 11 via the valve 13 as mentioned above. The end 12b is connected via a valve 15 to the washing-liquid supplying system 4. The remaining end 12c is connected to a gas suction port 108 of the gas exhaust system 3. The gas exhaust system 3 has a gas exhaust port 109 which is connected via a valve 16 to an exhaust pipe 17, which in turn connected to the recovery tank 5. The exhaust pipe 17 is connected to a branch pipe 18 which extends vertically and connected at its upper end to the trap system 6.

Figure 2:
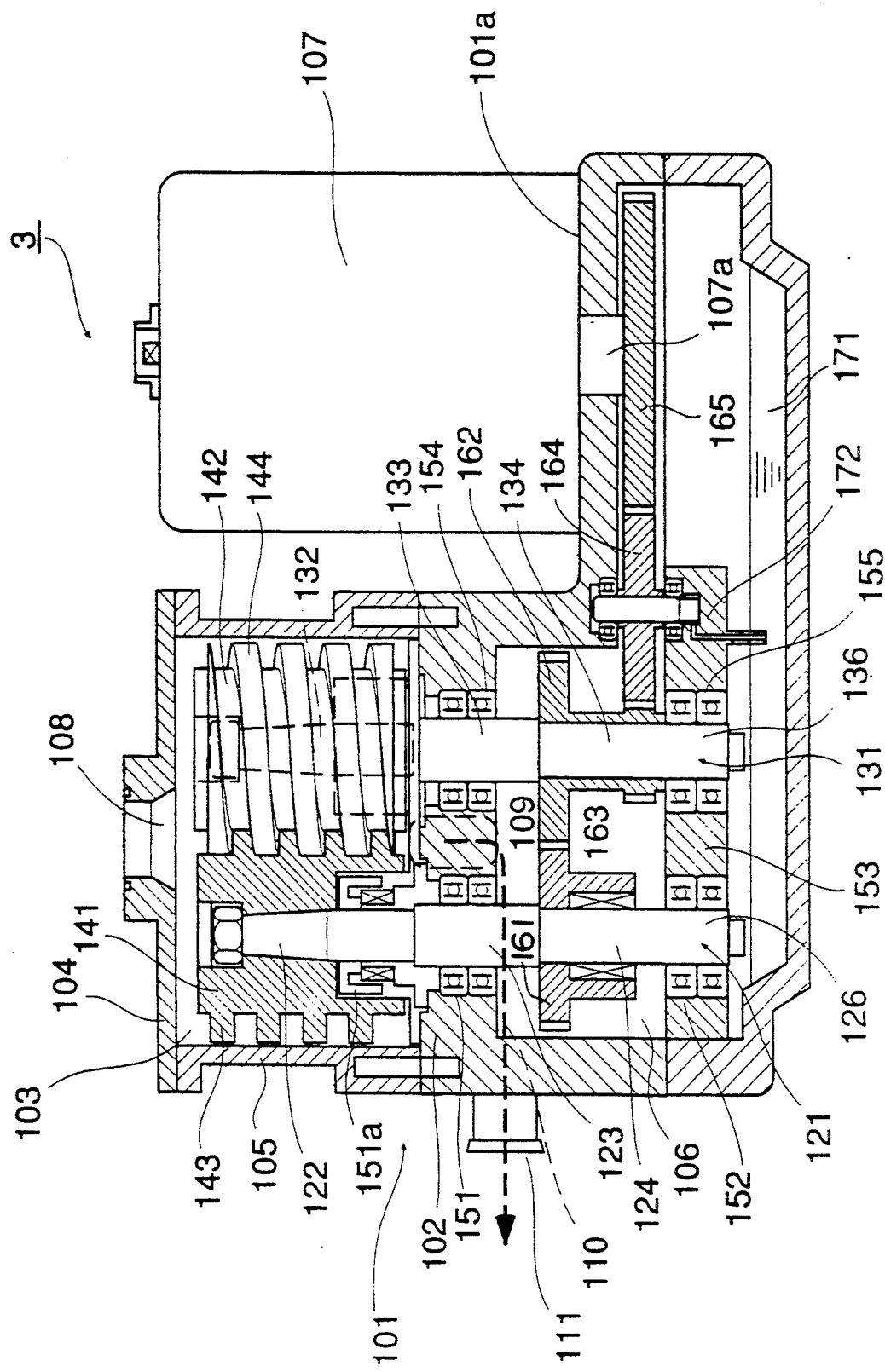
FIG. 2 is a schematic sectional view of the gas exhaust system of FIG. 1.

Now referring to FIG. 2, the gas exhaust system 3 of the present example will be described. The gas exhaust system 3 has a casing 101, an inner space of which is divided into upper and lower chambers by a partition wall 102. The upper chamber is a vacuum chamber 103 defined by top wall 104, a side wall 105 and the partition wall 102. Whereas, the lower chamber is a gear chamber 106. The casing 101 also has a lower top surface 101a on which a motor 107 is fixedly mounted vertically.

The top wall 104 of the vacuum chamber 103 is formed at its center with the gas suction port 108 connected to the end 12c of the branch pipe 12 as shown in FIG. 1. The partition wall 102 is also formed at its center with a gas exhaust port 109 which is connected to a connecting pipe 110 (shown by dotted line in FIG. 2) arranged laterally in the gear chamber 106 and having an end 111 exposing at the side surface of the casing 101. The end 111 of the connecting pipe 110 is connected to the pipe 16 via the valve 15 as shown in FIG. 1.

In the casing 101, first and second rotor shafts 121, 131 are arranged vertically and parallel with each other. The first shaft 121 has an upper-side shaft portion 122, a middle shaft portion 123 and a lower shaft portion 124. The upperside shaft portion 122 extends vertically and upwardly in the vacuum chamber 103 around which a first screw rotor 141 is fixedly mounted so as to rotate integrally. The middle shaft portion 123 of the first shaft 121 passes through the partition wall 102 where it is rotatably supported by a bearing mechanism 151 mounted on the partition wall 102. The lower-side shaft portion 124 of the first rotor shaft 121 extends vertically and downwardly in the gear chamber 106, and its lower end portion 126 is rotatably supported by a bering mechanism 152 mounted on a supporting plate 153 arranged in the gear chamber 106 and fixed on the casing 101. The bearing mechanism 151 is, for example, a thrust bearing and, is covered by an oil sealing 151a having a gas purging function on the side of the vacuum chamber 103.

Likewise, the second rotor shaft 131 has an upper-side shaft portion 132, a middle shaft portion 133 and a lowerside shaft portion 134. A second screw rotor 142 is fixedly mounted around the upper-side shaft portion 132 of the second rotor shaft 131. The middle shaft portion 133 and a lower end portion 136 of the lower-side shaft portion 134 are supported rotatably by bearing mechanisms 154, 155, respectively. As mentioned above, in the present example, the first and second rotor shafts 131 and 132 are arranged vertically and rotationally supported in the casing 101 by the bearing mechanisms 151, 152, 154 and 155. Further, the upper-side shaft portions 122, 132 of the rotor shafts 121, 131 extend vertically upwardly in the vacuum chamber 103 in a cantilevered condition.

The screw rotors 141 and 142 are formed on their circumferential surfaces with rectangular-shaped screws 143 and 144, respectively. These screws are of the same shape and size, but are formed to extend in opposite rotational directions so as to engage with each other in a manner that a constant clearance is formed between them. The screw rotors 141 and 142 are rotated in the opposite directions so that a vacuum state up to about $10^{-3}$ Tort is formed in the vacuum chamber 103.

A driving mechanism for the first and second screw rotors 141 and 142 will be explained. The screw rotors 141, 142 are rotated at a same rotational speed in the opposite directions by the motor 107 via a gear train constituted as follows. In the gear chamber 106, the lower-side shaft portion 124 of the first rotor shaft 121 has a first timing gear 161 integrally fixed thereon, and the lower-side shaft portion 134 of the second rotor shaft 131 also has a second timing gear 162 integrally fixed thereon, these timing gears 161 and 162 being engaged with each other. The second timing gear 162 is integrally connected to a first driven gear 163 which is engaged with a second driven gear 164 rotatably supported on the casing 101. The second driven gear 164 is engaged with a drive gear 165 fixed on a motor shaft 107a of the motor 107 extending vertically and downwardly in the gear chamber 106. In addition, lubricant oil 171 is stored on the bottom of the gear chamber 106 and is supplied to respective portions to be lubricated via oil passages (not shown) by a oil supplying pump 172. For example, the bearing mechanisms 151, 152, 154 and 155 are supplied with the lubricant oil 171.

A gas exhaust operation of the gas exhaust system 3 will be explained. In this operation, the valve 13 is set open while the valve 15 is closed. The motor 107 is driven to rotate the first and second rotor shafts 121 and 131 at the same rotational speed in the opposite directions, so that the first and second screw rotors 141 and 142 respectively fixed on the first and second shafts 121 and 131 also rotate at the same speed in the opposite directions in an engaged condition. Thus, the vacuum state is formed in the vacuum chamber 103, whereby the gasses remaining in the process chamber 2 are discharged therefrom via the pipe 11, the valve 13 and the branch pipe 12, and enter into the vacuum chamber 103 through the suction port 108. The gasses introduced in the vacuum chamber 103 are discharged therefrom through the gas exhaust port 109 by the continuous rotation of the first and second screw rotors 141, 142, and pass through the valve 16, the pipes 17 and 18 to reach the trap system 6, wherein the gasses are removed therefrom solid contents. Thereafter, the gasses are released to the atmosphere.

Figure 3:
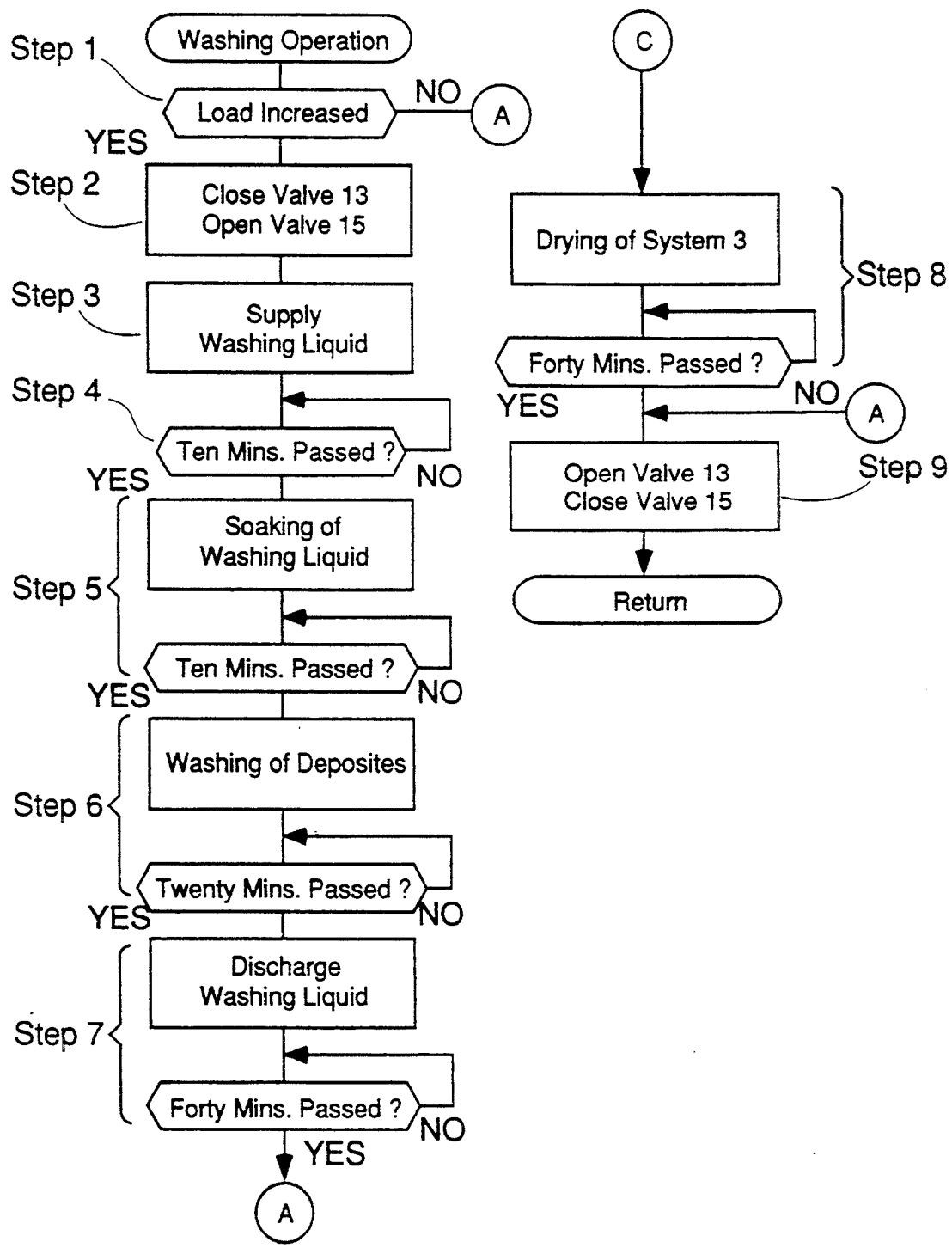
FIG. 3 is a flow chart showing a flushing operation of the gas exhaust system of FIG. 1.

With reference to FIG. 3, a washing operation of the gas exhaust system 3 will be described. The load of the gas exhaust system 3 is being monitored by the pressure meter 13. If the detected load exceeds a predetermined value (Step 1), the flushing operation of the gas exhaust system 3 begins manually or automatically. That is, the valve 13 is closed and the valve 15 is opened (Step 2). Then, the first and second screw rotors 141 and 142 are driven to rotate at a low speed by the motor 107, and at the same time, a washing liquid such as water, hot water, alcohol or the like is supplied to the gas exhaust system 3 from the washing-liquid supplying system 4 (Step 3). The drive of the rotors and the supply of the washing liquid are continued for about 10 minutes (Step 4), and after that they are stopped. The vacuum chamber 103 of the system 3 is filled with the washing liquid which is gradually soaked into deposits on the inner surface of the chamber 103, the screw rotors 141, 142 and others. After ten minutes passed (Step 5), the screw rotors 141, 142 are driven at a low speed again for about twenty minutes to thereby wash away the deposits from the inner surface of the chamber 103, the screw rotors 141, 142 and other portions (Step 6). Then, the screw rotors 141, 142 are rotated at a low speed for about 40 minutes, so that the washing liquid is discharged from the gas exhaust system 103 (Step 7), and the inner surface of the chamber 103 and the rotors 141, 142 and the like are dried by the self heat generation of the system 3 (Step 8). Finally, the valve 15 is closed and the valve 13 is opened (Step 9). Then, the gas exhaust system 3 returns to be a normal operation.

According the the present system 3, the rotors 141, 142 are arranged in the vacuum chamber 103 in a manner that they extend vertically and that they are supported at their lower-side ends by the bearing mechanisms 151, 154 in a cantilevered condition. Thus, the bearing mechanisms to which lubricant oil is supplied are positioned apart from the suction port 108 connected to the side of the process chamber 2, so that oil leakage or diffusion from the vacuum chamber 103 to the side of process chamber 2 can be prevented effectively.

Further, the washing operation can be carried out without removing the system 3 from the semiconductor manufacturing line. Hence, the washing operation can be carried out easily and effectively without greatly degrading the productivity of the semiconductor manufacturing device 1. Further, in the vacuum chamber 103, since the rotors 141 and 142 are arranged vertically in a cantilevered condition and the bearing mechanisms 151, 154 for the rotor shafts are positioned apart from the suction port 108 through which the washing liquid is introduced, the washing of the vacuum chamber 103 can be carried out effectively and rapidly.

I claim:

1. A gas exhaust system for use in a semiconductor manufacturing process wherein mechanical or chemical processing is applied on silicon wafters arranged in an air-tight process chamber thereof, comprising:
   a vacuum chamber having a gas suction port formed on an upper side thereof and a gas exhaust port formed on a lower side thereof;
   a branched passage which has a main passage connected to said gas suction port and first and second branch passages branched from said main passage, said first branch passage being designed to connect to said process chamber via a gas exhaust line, and said second branch passage designed to connect to a washing-liquid supplying line through which a washing liquid is supplied to said vacuum chamber;
   a first valve provided between said first branch passage and said process chamber;
   a second valve provided between said second branch passage and said washing-liquid supplying line;
   a first rotational shaft which has an upper-side shaft portion extending vertically and upwardly in said vacuum chamber from said lower side of said vacuum chamber and a lower-side shaft portion extending vertically and downwardly from said lower side of said vacuum chamber;
   a second rotational shaft, arranged parallel to said first shaft portion and apart therefrom, which has an upper-side shaft portion extending vertically and upwardly in said vacuum chamber from said lower side of said vacuum chamber and a lower-side shaft portion extending vertically and downwardly from said lower side of said vacuum chamber;
   first and second rotors fixed on said upper-side shaft portions of said first and second shaft, respectively which are formed with rectangular-shaped screws on their circumferential surfaces, said screws being same shape and size but extending in opposite rotational directions so as to engage with each other;
   first bearing means for rotationally supporting upper sides of said lower-side shaft portions of said first and second shafts;
   second bearing means for rotationally supporting lower sides of said lower-side shaft portions of said first and second shafts; and
   drive means for rotating said first and second shafts in opposite directions.

2. A semiconductor manufacturing system comprising a processing chamber in which mechanical or chemical processing is applied to silicon wafers arranged therein, a gas exhaust system for removing gasses remaining in said process chamber, and a washing-liquid supplying means for supplying a washing liquid in order to wash said gas exhaust system, wherein said gas exhaust system comprises:
   a vacuum chamber having a gas suction port formed on an upper side thereof and a gas exhaust port formed on a lower side thereof;
   a branched passage which has a main passage connected to said gas suction port and first and second branch passages branched from said main passage, said first branch passage being connected to said processing chamber via a gas exhaust line, and said second branch passage being connected to said washing-liquid supplying means;
   a first valve provided between said first branch passage and said processing chamber;

a second valve provided between said second branch passage and said washing-liquid supplying means;

a first rotational shaft which has an upper-side shaft portion extending vertically and upwardly in said vacuum chamber from said lower side of said vacuum chamber and a lower-side shaft portion extending vertically and downwardly from said lower side of said vacuum chamber;

a second rotational shaft, arranged parallel to said first shaft portion and apart therefrom which has an upper-side shaft portion extending vertically and upwardly in said vacuum chamber from said lower side of said vacuum chamber and a lower-side shaft portion extending vertically and downwardly from said lower side of said vacuum chamber;

first and second rotors fixed on said upper-side shaft portions of said first and second shaft, respectively which are formed with rectangular-shaped screws on their circumferential surfaces, said screws being same shape and size but extending in opposite rotational directions so as to engage with each other;

a first bearing for rotationally supporting upper sides of said lower-side shaft portions of said first and second shafts;

a second bearing for rotationally supporting lower sides of said lower-side shaft portions of said first and second shafts; and drive means for rotating said first and second shafts in opposite directions.

* * * * *